March 18, 1969 R. L. BRONNES ET AL 3,432,913
METHOD OF JOINING A SEMI-CONDUCTOR TO A BASE
Filed Nov. 26, 1965
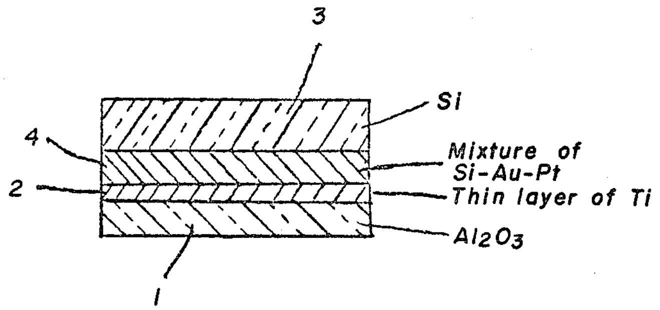
INVENTORS
ROBERT L. BRONNES
RAY C. HUGHES
RICHARD C. SWEET
BY Frank R. Trifari
AGENT 3,432,913

METHOD OF JOINING A SEMI-CONDUCTOR TO A BASE

Robert L. Bronnes, Irvington-on-Hudson, Richard C. Sweet, North Tarrytown, and Ray C. Hughes, Ossining, N.Y., assignors to North American Philips Company, Inc., New York, N.Y., a corporation of Delaware Continuation-in-part of application Ser. No. 301,866, Aug. 13, 1963. This application Nov. 26, 1965, Ser. No. 510,018
U.S. Cl. 29—472.7 4 Claims
Int. Cl. B23k *31/02;* H01l *7/24*

ABSTRACT OF THE DISCLOSURE

A method of bonding silicon or germanium to a substrate of a refractory material such as alumina, beryllium oxide, molybdenum or tungsten wherein the substrate is covered with a thin sputtered layer of titanium, tantalum, or columbium, which is covered with a layer of platinum and a layer of gold is applied over the platinum. The so-coated substrate is then pressed together with the silicon or germanium and heated to a temperature at which a eutectic mixture of gold, platinum and silicon or germanium is formed and the assembly allowed to cool to solidify the melt.

This application is a continuation-in-part of application Ser. No. 301,866 filed Aug. 13, 1963.

The invention relates to a method of joining two objects at least one of which is a non-metal and in particular relates to the fabrication of semi-conductor device structures employing a silicon or germanium semi-conductor which is bonded to a ceramic or metal base.

It is often desirable to join a silicon or germanium surface to another surface either electrically conducting or insulating to serve as a mount and as a heat transfer medium. In cases in which electrical isolation of the semi-conductor surface is desired, ceramics such as aluminum oxide and beryllium oxide are particularly suitable by virtue of their excellent electrical properties and high thermal conductivity. Where electrical isolation is not required, a metal such as molybdenum serves well because of its appropriate coefficient of thermal expansion, and good heat conductivity.

In the parent application, there has been described a method of metallizing ceramics for the purpose of joining them by brazing techniques to metals. In the technique therein described a sputtered metal film is applied to the surface of the ceramic which is then covered by a protective metal such as platinum or gold which can be brazed to a metal surface. Essentially that technique is employed here except that particular metals are employed for the purpose of facilitating the bonding of the silicon or germanium to either a ceramic or metal surface. A particular advantage of the technique according to this invention is that the silicon or germanium may be gold bonded to a metallized ceramic surface in air. This eliminates the need for a protective atmosphere.

In accordance with the invention, we apply a sputtered film of one of the metals, titanium, tantalum or columbium to a ceramic surface in accordance with the method described in the aforesaid application. To such a premetallized ceramic surface or to a surface of massive metal of one of the foregoing metals, or of molybdenum or tungsten, we apply first a layer of platinum and then a layer of gold. Finally, silicon or germanium is bonded to the gold surface through the formation and subsequent freezing of the melts of respectively gold-silicon or gold-germanium. The joining together or bonding is carried out by bringing together the gold-coated surface and the semi-conductor surface under at least slight pressure, heating the assembly to a temperature equal to or somewhat above the pertinent eutectic temperature, holding at a temperature above that of the eutectic point for a sufficient time for a molten alloy to form and cooling to establish the bond.

We have found that the described combination of metallization functions in a particularly advantageous way. When the alloy of gold and the semi-conductor has become fully molten it tends to spread without limit over the gold surface, involving progressive and unlimited dissolution of both gold and semi-conductor. However, in the described combination of metals, as soon as the full thickness of the gold layer has been penetrated by the molten alloy platinum is exposed to the dissolving action of the melt. Platinum is then brought into solution. The incorporation of platinum converts the binary eutectic into a ternary system of melting point which increases with increasing platinum content. Therefore, the melting point of the alloy rises until it reaches the working temperature, at which time the alloy solidifies. By a judicious choice of thicknesses of gold, and of platinium, and an appropriate brazing temperature, the amount of melt formed, and the extent to which it spreads away from the area contacted by the semi-conductor may be closely controlled. There results from this action an excellent brazed joint between the semi-conductor and the platinum plus gold metallized surface.

The described composition and structure for the surface metallization has the further advantage of being highly resistant to oxidation at the temperatures appropriate for forming joints to silicon and germanium. Accordingly, the joining operation may be carried out in air, requiring no special precautions against oxidation and tarnishing of the metallizing film.

The invention will be described with reference to the accompanying drawing, the sole figure of which shows a silicon body bonded to an alumina base in accordance with the technique according to the invention.

A base 1 of alumina is first metallized by cathodically sputtering a thin film of titanium 2 on the surface of the alumina. Next a layer of platinum is deposited over the thin titanium film and then a layer of gold is applied over the platinum layer. The silicon body 3 is placed on the gold layer and slight pressure applied to bring the two surfaces into contact. The assembly is heated to a temperature of about 400° C. at which the gold forms a eutectic melt (M.P. 370° C.) with the silicon. The heating is continued and a higher melting mixture of silicon-gold-platinum is formed which upon cooling solidifies to form a layer 4 which bonds the silicon to the alumina. The bonding may take place in air since the platinum prevents oxidation of the titanium and permits the gold bonding to be carried out in air.

Although in the example described the silicon is bonded to alumina the surface of which has been metallized as described in the co-pending application, it can be bonded equally well to a body of molybdenum the surface of which has been covered with a platinum layer, preferably by sputtering techniques described in the co-pending application.

While we have described the invention with reference to particular examples and applications thereof, other modifications will be apparent to those skilled in the art without departing from the spirit and scope of the invention as defined in the appended claims.

What is claimed is:

1. A method of joining a body of a material selected from the group consisting of silicon and germanium to a second body of a refractory material selected from the group consisting of alumina, beryllium oxide and refractory metals comprising the steps of depositing a layer of platinum on a surface of said second body covered with a sputtered layer of a metal selected from the group consisting of titanium, tantalum and columbium, depositing a layer of gold on said platinum layer, placing a surafce of the first body in contact with the gold layer, applying pressure to the bodies, heating the assembly in air to a temperature of about 400° C. to form a eutectic of the material of the first body and gold, continuing to heat the assembly at said temperature to form a mixture of the eutectic with platinum, and cooling the assembly to form a bond.

2. A method as claimed in claim 1 in which the other body is molybdenum.

3. A method as claimed in claim 1 in which the other body is alumina.

4. A method as claimed in claim 1 in which the other body is beryllium oxide.

References Cited

UNITED STATES PATENTS

| | | | |
|---|---|---|---|
| 3,298,093 | 1/1967 | Cohen | 29—504 X |
| 3,316,628 | 5/1967 | Lang | 29—472.7 |

WILLIAM T. BROOKS, *Primary Examiner.*

U.S. Cl. X.R.

29—473.1, 502, 504, 590